(12) United States Patent
Arii et al.

(10) Patent No.: US 9,914,662 B2
(45) Date of Patent: Mar. 13, 2018

(54) PREPREG, METAL FOIL-CLAD LAMINATE, AND PRINTED WIRING BOARD

(75) Inventors: Kenj Arii, Tokyo (JP); Kentaro Nomizu, Tokyo (JP); Masanobu Sogame, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 721 days.

(21) Appl. No.: 14/007,817

(22) PCT Filed: Mar. 15, 2012

(86) PCT No.: PCT/JP2012/056673
§ 371 (c)(1),
(2), (4) Date: Dec. 9, 2013

(87) PCT Pub. No.: WO2012/132923
PCT Pub. Date: Oct. 4, 2012

(65) Prior Publication Data
US 2014/0113518 A1    Apr. 24, 2014

(30) Foreign Application Priority Data
Mar. 29, 2011 (JP) ................ 2011-072637

(51) Int. Cl.
| | |
|---|---|
| *C03C 25/34* | (2006.01) |
| *C08G 10/04* | (2006.01) |
| *C08L 61/18* | (2006.01) |
| *C08L 61/34* | (2006.01) |
| *C08L 63/00* | (2006.01) |
| *B32B 15/08* | (2006.01) |
| *C03C 25/10* | (2018.01) |
| *C03C 25/36* | (2006.01) |
| *C03C 25/48* | (2006.01) |
| *C08J 5/24* | (2006.01) |
| *B32B 15/14* | (2006.01) |
| *H05K 1/03* | (2006.01) |
| *H05K 3/02* | (2006.01) |
| *C08K 3/00* | (2018.01) |

(52) U.S. Cl.
CPC .............. *C03C 25/34* (2013.01); *B32B 15/08* (2013.01); *B32B 15/14* (2013.01); *C03C 25/101* (2013.01); *C03C 25/36* (2013.01); *C03C 25/48* (2013.01); *C08G 10/04* (2013.01); *C08J 5/24* (2013.01); *C08L 61/18* (2013.01); *C08L 61/34* (2013.01); *C08L 63/00* (2013.01); *H05K 1/0366* (2013.01); *B32B 2260/021* (2013.01); *B32B 2260/046* (2013.01); *B32B 2305/076* (2013.01); *B32B 2457/08* (2013.01); *C08J 2361/18* (2013.01); *C08J 2361/34* (2013.01); *C08J 2463/00* (2013.01); *C08K 3/0033* (2013.01); *H05K 1/0373* (2013.01); *H05K 3/022* (2013.01); *H05K 2201/0209* (2013.01); *Y10T 442/2221* (2015.04); *Y10T 442/3407* (2015.04)

(58) Field of Classification Search
CPC ....... C03C 25/34; C03C 25/101; C03C 25/36; C03C 25/48; C08G 10/04; C08J 5/24; C08J 2361/18; C08J 2361/34; C08J 2463/00; C08L 61/18; C08L 61/34; C08L 63/00; H05K 1/0366; H05K 1/0373; H05K 2201/0209; H05K 2201/0761; Y10T 442/2221; Y10T 442/3407; B32B 2260/021; B32B 2305/076; B32B 2363/00; B32B 15/08; B32B 15/14; H05H 2201/05
USPC ................. 442/79, 117, 175, 176, 223, 232; 428/416, 460
See application file for complete search history.

(56) References Cited

U.S. PATENT DOCUMENTS

| | | | |
|---|---|---|---|
| 2008/0044667 A1 | 2/2008 | Abe et al. | |
| 2009/0088535 A1* | 4/2009 | Arita ................ | C08G 59/063 525/390 |
| 2010/0096173 A1* | 4/2010 | Fujino ............... | C08G 59/50 174/258 |
| 2010/0316950 A1 | 12/2010 | Oguru et al. | |
| 2010/0324255 A1 | 12/2010 | Kita et al. | |
| 2011/0009574 A1 | 1/2011 | Kita et al. | |
| 2012/0238775 A1 | 9/2012 | Kita et al. | |

FOREIGN PATENT DOCUMENTS

| | | |
|---|---|---|
| CN | 101889037 | 11/2010 |
| JP | 2000-119369 | 4/2000 |
| JP | 2004-091550 | 3/2004 |
| JP | 2004-123859 | 4/2004 |
| JP | 2009-001812 | 1/2009 |
| JP | 2009-108147 | 5/2009 |
| JP | 2009-155638 | 7/2009 |
| JP | 2011-037993 | 2/2011 |
| TW | 200635985 | 10/2006 |
| TW | 200936623 | 9/2009 |
| WO | 03/055927 | 7/2003 |

OTHER PUBLICATIONS

International Search Report Issued in PCT/JP2012/056673 dated May 29, 2012.

* cited by examiner

*Primary Examiner* — Peter Y Choi
*Assistant Examiner* — Jennifer Gillett
(74) *Attorney, Agent, or Firm* — Greenblum & Bernstein, P.L.C.

(57) ABSTRACT

A prepreg having low water absorption, and having remarkably suppressed deterioration in insulation resistance over time, and further having excellent heat resistance, a metal foil-clad laminate using the prepreg, and a printed wiring board using the metal foil-clad laminate are provided. A prepreg of the present invention is obtained by impregnating or coating a base material (D) with a resin composition comprising: a naphthol-modified dimethylnaphthalene formaldehyde resin (A); an epoxy resin (B) having an epoxy equivalent of 200 to 400 g/eq.; and an inorganic filler (C).

3 Claims, No Drawings

PREPREG, METAL FOIL-CLAD LAMINATE, AND PRINTED WIRING BOARD

TECHNICAL FIELD

The present invention relates to a prepreg, a metal foil-clad laminate using the prepreg, and a printed wiring board.

BACKGROUND ART

In recent years, there are increasingly accelerated high integration and miniaturization of semiconductors widely used in electronic equipment, communication instruments, personal computers or the like. This demands various better characteristics of laminates for semiconductor plastic packages.

Conventionally, as the laminates used in the semiconductor plastic packages, a prepreg and a metal foil-clad laminate obtained by impregnating or coating a base material with a resin composition containing an epoxy resin and a curing agent are widely known. Further, various curing agents such as amines, acid anhydrides, and phenols are known.

Phenolic resins are used as the curing agent of the resin composition for the laminate for semiconductor plastic package. Among them, phenol-based resins having a small number of hydroxyl groups with respect to a molecular weight are known as the phenolic resins having low water-absorption properties. For example, a biphenylaralkyl-based phenolic resin, a naphthol aralkyl-based phenolic resin, and a novolac-based phenolic resin obtained by reacting a naphthalene formaldehyde resin with phenols or the like are known as the phenol-based resins having low water-absorption properties (for example, see Patent Literatures 1 to 5).

CITATION LIST

Patent Literature

Patent Literature 1: Japanese Patent Laid-Open No. 2004-123859
Patent Literature 2: Japanese Patent Laid-Open No. 2009-001812
Patent Literature 3: Japanese Patent Laid-Open No. 2009-108147
Patent Literature 4: International Publication No. WO 03/055927
Patent Literature 5: Japanese Patent Laid-Open No. 2009-155638

SUMMARY OF INVENTION

Technical Problem

In recent years, the reduction in the water absorption of the laminate for the semiconductor plastic package has been strongly desired. This is because a decrease in insulation resistance which may be generated when the laminate absorbs water, and insulation failure such as ion migration are easily caused by the miniaturization of a circuit. However, the conventional phenolic resin used as the curing agent is merely used for the purpose of mainly improving the flame retardancy of a cured material. The phenolic resin is not sufficiently considered from the viewpoint of a reduction in water absorption in a prepreg, a printed wiring board or the like, which is a resin composition or a cured material thereof.

The present invention has been made in view of the above problems. It is an object of the present invention to provide a prepreg having low water absorption, and of which deterioration in insulation resistance over time is remarkably suppressed, a metal foil-clad laminate using the prepreg, and a printed wiring board using the metal foil-clad laminate. It is another object of the present invention to provide a prepreg having low water absorption, and of which deterioration in insulation resistance over time is remarkably suppressed, and further having excellent heat resistance, a metal foil-clad laminate using the prepreg, and a printed wiring board using the metal foil-clad laminate.

Solution to Problem

The present inventors have diligently studied in order to solve the problems. As a result, the inventors found that the problems are solved by using a resin composition containing a specific naphthol-modified dimethylnaphthalene formaldehyde resin (A), an epoxy resin (B) having an epoxy equivalent of 200 to 400 g/eq., and an inorganic filler (C). The present invention has been attained.

That is, the present invention provides the following [1] to [8].

[1]
A prepreg obtained by impregnating or coating a base material (D) with a resin composition containing:
a naphthol-modified dimethylnaphthalene formaldehyde resin (A);
an epoxy resin (B) having an epoxy equivalent of 200 to 400 g/eq.; and
an inorganic filler (C), wherein the naphthol-modified dimethylnaphthalene formaldehyde resin (A) is obtained by condensing a dimethylnaphthalene formaldehyde resin and (c) a naphthol compound represented by the following general formula (1) in the presence of an acidic catalyst,

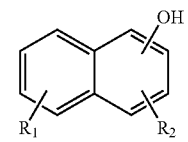

(1)

wherein $R_1$ and $R_2$ each independently represent a hydrogen atom or an alkyl group having 1 to 3 carbon atoms, and
the dimethylnaphthalene formaldehyde resin obtained by condensing (a) at least one dimethylnaphthalene selected from the group consisting of 1,5-dimethylnaphthalene, 1,6-dimethylnaphthalene, 2,6-dimethylnaphthalene, 1,7-dimethylnaphthalene, 1,8-dimethylnaphthalene, and 2,7-dimethylnaphthalene and (b) formaldehyde in the presence of an acidic catalyst.

[2]
The prepreg according to [1], wherein the epoxy resin (B) is a biphenylaralkyl-based epoxy resin.

[3]
The prepreg according to [1] or [2], wherein a hydroxyl equivalent of the naphthol-modified dimethylnaphthalene formaldehyde resin (A) is 300 to 600 g/eq.

[4]
The prepreg according to any one of [1] to [3], wherein the inorganic filler (C) is silica.

[5]
The prepreg according to any one of [1] to [4], wherein a content of the naphthol-modified dimethylnaphthalene formaldehyde resin (A) is 40 to 70 parts by mass based on 100 parts by mass in total of the (A) ingredient and the (B) ingredient.
[6]
The prepreg according to any one of [1] to [5], wherein a content of the inorganic filler (C) is 5 to 300 parts by mass based on 100 parts by mass in total of the (A) ingredient and the (B) ingredient.
[7]
A metal foil-clad laminate using the prepreg according to any one of [1] to [6].
[8]
A printed wiring board using the metal foil-clad laminate according to [7].

Advantageous Effects of Invention

The present invention can simply achieve a prepreg having low water absorption, and of which deterioration in insulation resistance over time is remarkably suppressed, with good reproducibility. Furthermore, the present invention can also achieve a prepreg having heat resistance equivalent to that of a conventional product. Therefore, by using the prepreg, the present invention can easily achieve a metal foil-clad laminate and a printed wiring board which have low water absorption and remarkably improved temporal stability of insulation resistance while having heat resistance equivalent to that of the conventional product. As a result, the reliability of a product is improved.

DESCRIPTION OF EMBODIMENTS

Hereinafter, an embodiment of the present invention will be described. The following embodiment is illustrative in order to describe the present invention. The present invention is not limited only to the embodiment.

A prepreg of the present embodiment is obtained by impregnating or coating a base material (D) with a resin composition containing: a specific naphthol-modified dimethylnaphthalene formaldehyde resin (A); an epoxy resin (B) having an epoxy equivalent of 200 to 400 g/eq.; and an inorganic filler (C).

The naphthol-modified dimethylnaphthalene formaldehyde resin (A) used herein is obtained by condensing a dimethylnaphthalene formaldehyde resin and (c) a naphthol compound represented by the following general formula (1) in the presence of an acidic catalyst. The dimethylnaphthalene formaldehyde resin is obtained by condensing (a) at least one dimethylnaphthalene selected from the group consisting of 1,5-dimethylnaphthalene, 1,6-dimethylnaphthalene, 2,6-dimethylnaphthalene, 1,7-dimethylnaphthalene, 1,8-dimethylnaphthalene, and 2,7-dimethylnaphthalene and (b) formaldehyde in the presence of an acidic catalyst:

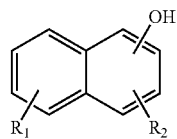

(1)

wherein $R_1$ and $R_2$ each independently represent a hydrogen atom or an alkyl group having 1 to 3 carbon atoms.

As the formaldehyde used in the above-mentioned condensation reaction with the dimethylnaphthalene, compounds capable of generating formaldehyde such as formalin, paraformaldehyde and trioxan and the like, all of which are industrially easily available can be utilized. Herein, the compounding amount of the dimethylnaphthalene and the formaldehyde when performing the condensation reaction is not particularly limited. However, from the viewpoint of increasing yield, a molar ratio of the dimethylnaphthalene to the formaldehyde is preferably 1:1 to 1:6, more preferably 1:2 to 1:6, and still more preferably 1:2.5 to 1:5. Examples of the acidic catalyst used in the condensation reaction of the dimethylnaphthalene and the formaldehyde include, but are not particularly limited to, sulfuric acid. The condensation reaction can also be performed in the presence of water and an acidic catalyst if necessary.

The synthesis condition of the dimethylnaphthalene formaldehyde resin may be performed by properly applying a known technique without particular limitation. For example 1,5-dimethylnaphthalene, a formalin aqueous solution, and concentrated sulfuric acid are placed in a reaction vessel, and are reacted by stirring while refluxing upon heating in a nitrogen gas stream. Then, the reactant is neutralized by an acid, and is extracted by an organic solvent. Thereby, a 1,5-dimethylnaphthalene formaldehyde resin can be obtained.

Specific examples of an alkyl group having 1 to 3 carbon atoms in (c) the naphthol compound used in the naphthol modification of the dimethylnaphthalene formaldehyde resin and represented by general formula (1) include a methyl group, an ethyl group, an n-propyl group, and an isopropyl group. Furthermore, in (c) the naphthol compound represented by general formula (1), each of $R_1$ and $R_2$ is preferably a hydrogen atom. More specifically, (c) the naphthol compound represented by general formula (1) is more preferably 1-naphthol or 2-naphthol.

Examples of the acidic catalyst used in the naphthol modification of the dimethylnaphthalene formaldehyde resin include, but are not particularly limited to, sulfuric acid and p-toluenesulfonic acid. Among them, the p-toluenesulfonic acid is preferable.

Other synthesis condition in the naphthol modification of the dimethylnaphthalene formaldehyde resin can be performed by properly applying a known technique without particular limitation. For example, the dimethylnaphthalene formaldehyde resin and (c) the naphthol compound represented by general formula (1) are refluxed upon heating in the presence of the acidic catalyst, and thereby the naphthol-modified dimethylnaphthalene formaldehyde resin (A) can be obtained. Although the condensation reaction is usually performed at atmospheric pressure, the condensation reaction may also be performed under an elevated pressure if necessary. Furthermore, a solvent which is inert to the condensation reaction can be used if necessary. Examples of the solvent include aromatic hydrocarbons such as toluene, ethylbenzene, and xylene; saturated aliphatic hydrocarbons such as heptane and hexane; alicyclic hydrocarbons such as cyclohexane; ketones such as methyl isobutyl ketone; ethers such as dioxane and dibutyl ether; alcohols such as 2-propanol; carboxylic acid esters such as ethyl propionate; and carboxylic acids such as acetic acid. A heating temperature in the presence of the acidic catalyst is not particularly limited. However, from the viewpoint of the high viscosity of the resin, the heating temperature is preferably 100 to 250° C., more preferably 120 to 200° C., and still more preferably 150 to 200° C. Inactive gases such as nitrogen, helium, argon, and water vapor may be passed in a reaction system. A general method may be employed, which if necessary, further adds the solvent for dilution after the end of the reaction, allows the mixture to stand to cause two-phase separation, separates a resin phase as an oily phase from an aqueous phase, further washes it with water, thereby completely removing the acidic catalyst, and then removes the added solvent and the unreacted naphthol compound by distillation, or the like.

The naphthol-modified dimethylnaphthalene formaldehyde resin (A) obtained as described above preferably has a hydroxyl equivalent of 300 to 600 g/eq. without particular limitation. A prepreg having low water absorption and having heat resistance equivalent to that of the conventional product tends to be easily obtained by using the naphthol-modified dimethylnaphthalene formaldehyde resin (A) having a hydroxyl equivalent made to fall within this range. The hydroxyl equivalent of the naphthol-modified dimethylnaphthalene formaldehyde resin (A) can be adjusted by the compounding ratio of the dimethylnaphthalene formaldehyde resin and the naphthol compound in the naphthol modification.

The content of the naphthol-modified dimethylnaphthalene formaldehyde resin (A) may be properly set according to desired properties without particular limitation. From the viewpoint of the water absorption of the obtained prepreg or the like, the content of the naphthol-modified dimethylnaphthalene formaldehyde resin (A) is preferably 40 to 70 parts by mass based on 100 parts by mass in total of the naphthol-modified dimethylnaphthalene formaldehyde resin (A) and the epoxy resin (B). The naphthol-modified dimethylnaphthalene formaldehyde resins (A) may be used singly or in combinations of two or more.

By contrast, a known epoxy resin, for example, an epoxy resin used as a material for a printed wiring board may be properly used as the epoxy resin (B) having an epoxy equivalent of 200 to 400 g/eq. used in the present embodiment as long as the epoxy equivalent satisfies the range. The kind thereof is not particularly limited. Specific examples thereof include biphenylaralkyl-based epoxy resins, bisphenol A-based epoxy resins, bisphenol E-based epoxy resins, bisphenol F-based epoxy resins, bisphenol S-based epoxy resins, phenol novolac-based epoxy resins, cresol novolac-based epoxy resins, bisphenol A novolac-based epoxy resins, trifunctional phenol-based epoxy resins, tetrafunctional phenol-based epoxy resins, naphthalene-based epoxy resins, biphenyl-based epoxy resins, aralkyl novolac-based epoxy resins, alicyclic epoxy resins, polyol-based epoxy resins, glycidyl ester-based epoxy resins, phenolaralkyl-based epoxy resins, aralkyl novolac-based epoxy resins, biphenylaralkyl-based epoxy resins, naphtholaralkyl-based epoxy resins, dicyclopentadiene-based epoxy resins, polyol-based epoxy resins, glycidylamines, glycidyl esters, compounds obtained by epoxidizing a double bond of butadiene and the like, and compounds obtained by reacting hydroxyl-containing silicone resins with epichlorohydrin or halides thereof. These may be used singly or in combinations of two or more. Among them, from the viewpoint of flame retardancy, heat resistance and the like when the epoxy resin (B) and the naphthol-modified dimethylnaphthalene formaldehyde resin (A) are used in combination, the epoxy resin (B) is preferably the biphenylaralkyl-based epoxy resin. Especially, an epoxy resin represented by the following formula (2) is particularly preferable:

(2)

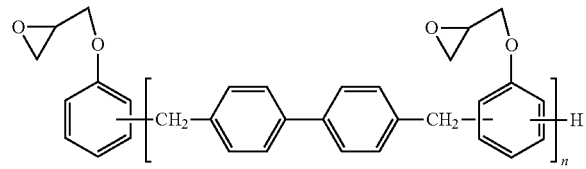

wherein n represents an integer of 1 or more.

From the viewpoint of realizing the prepreg having low water absorption, or the like, the epoxy equivalent of the epoxy resin (B) needs to be 200 to 400 g/eq. From the viewpoint of the water absorption of the obtained prepreg or the like, the epoxy equivalent is more preferably 250 to 350 g/eq.

The content of the epoxy resin (B) may be properly set according to desired properties without particular limitation. From the viewpoint of the water absorption and the heat resistance of the obtained prepreg or the like, the content of the epoxy resin (B) is preferably 30 to 60 parts by mass based on 100 parts by mass in total of the naphthol-modified dimethylnaphthalene formaldehyde resin (A) and the epoxy resin (B).

An inorganic filler known in the art may be properly selected and used as the inorganic filler (C) used in the present embodiment without particular limitation. Specific examples thereof include, but are not particularly limited to, silicas such as natural silica, synthetic silica, fused silica, amorphous silica, and hollow silica, boehmite, molybdenum compounds such as molybdenum oxide and zinc molybdate, zinc borate, zinc stannate, alumina, zinc oxide, magnesium oxide, zirconium oxide, aluminium hydroxide, boron nitride, clay, kaolin, talc, calcined clay, calcined kaolin, calcined talc, mica, glass short fibers (including fine powders of glasses such as E-glass, T-glass, D-glass, S-glass, and Q-glass), hollow glass, and spherical glass. These may be used singly or in combinations of two or more. Among them, from the viewpoint of characteristics of a laminate such as a low coefficient of thermal expansion, the silicas are preferably used as the inorganic filler (C).

The content of the inorganic filler (C) may be properly set according to desired properties without particular limitation. From viewpoint of the characteristics of the laminate such as the low coefficient of thermal expansion of the obtained prepreg or the like, the handleability upon manufacturing, and the impregnatability into a glass cloth, the content of the inorganic filler (C) is preferably 5 to 300 parts by mass based on 100 parts by mass in total of the naphthol-modified dimethylnaphthalene formaldehyde resin (A) and the epoxy resin (B), and more preferably 150 to 300 parts by mass.

The prepreg of the present embodiment can be obtained by impregnating or coating a base material (D) with a resin composition containing the (A) ingredient to the (C) ingredient. Herein, the resin composition may contain a silane coupling agent and a wet dispersing agent in such an amount that does not sacrifice desired characteristics of the resin composition. The dispersibility of the inorganic filler in the resin composition can be improved by incorporating the silane coupling agent or the wet dispersing agent.

Any silane coupling agent commonly used for surface treatment of inorganic materials may be suitably used without particular limitation. Specific examples thereof include, but are not particularly limited to, aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. These may be used singly or in combinations of two or more.

Any dispersion stabilizer used for coating materials may be suitably used as the wet dispersing agent without particular limitation. Especially, the wet dispersing agent is preferably a polymer wet dispersing agent having an acid group(s), and more preferably a polymer wet dispersing agent having an acid value of 20 to 200 mgKOH/g. Specific examples thereof include, but are not particularly limited to, polymer wet dispersing agents manufactured by BYK Japan K.K. such as Disperbyk-110, Disperbyk-111, Disperbyk- 180, BYK-161, BYK-W996, BYK-W9010, BYK-W903, and BYK-W940. These may be used singly or in combinations of two or more.

Furthermore, the resin composition may contain curing accelerators to properly adjust a curing speed if necessary. This type of curing accelerator is known in the art. For example, any curing accelerator commonly used as curing accelerators for epoxy resins or phenolic resins may be suitably used. Specific examples of the curing accelerator include, but are not particularly limited to, organometal salts of copper, zinc, cobalt, nickel or the like, imidazoles and derivatives thereof, and tertiary amines. These may be used singly or in combinations of two or more.

Furthermore, the resin composition may contain solvents if necessary. For example, by using the organic solvents are used, the viscosity of the resin composition when the resin composition is prepared can be lowered, to improve the handleability of the resin composition and the impregnatability of a glass cloth with the resin composition. Any solvent may be used without particular limitation as long as the mixture of the naphthol-modified dimethylnaphthalene formaldehyde resin (A) and the epoxy resin (B) can be dissolved therein or is compatible therewith. Specific examples thereof include ketones such as acetone, methyl ethyl ketone, methyl isobutyl ketone, and cyclohexanone, aromatic hydrocarbons such as benzene, toluene, and xylene, amides such as dimethylformamide and dimethylacetamide, and propylene glycol methyl ether and acetate thereof. These may be used singly or in combinations of two or more.

The resin composition may contain ingredients other than those listed above in such an amount that does not sacrifice desired characteristics of the resin composition. Examples of the optional ingredients include various polymeric compounds such as heat-curable resins, thermoplastic resins, and oligomers or elastomers thereof, flame-retardant compounds, and various additives other than those listed above. Any of them which are commonly used in the art may be used without particular limitation. Specific examples of the flame-retardant compounds include nitrogen-containing compounds such as melamine and benzoguanamine, and oxazine ring-containing compounds. Specific examples of the additives include ultraviolet absorbers, antioxidants, photopolymerization initiators, fluorescent brighteners, photosensitizers, dyes, pigments, thickeners, lubricants, antifoaming agents, dispersants, leveling agents, brighteners, and polymerization inhibitors. These optional ingredients may be used singly or in combinations of two or more.

The resin composition can be prepared by an ordinary method. As long as the method is a preparing method providing a resin composition uniformly containing the naphthol-modified dimethylnaphthalene formaldehyde resin (A), the epoxy resin (B), the inorganic filler (C), and the other optional ingredients, the preparing method is not particularly limited. For example, a mixture obtained by incorporating the inorganic filler (C) into the epoxy resin (B) is dispersed in a homomixer or the like. Then, the naphthol-modified dimethylnaphthalene formaldehyde resin (A) is incorporated into the mixture, and the mixture is sufficiently stirred. Thereby, the resin composition can be easily prepared. Known treatments (stirring, mixing, kneading treatments or the like) can be performed to uniformly dissolve or disperse ingredients when the resin composition is prepared. For example, in the case of the titanium dioxide (C), stirring-dispersion treatment is performed by using a stirring vessel to which a stirrer having suitable stirring capability is attached, to improve the dispersibility of the titanium dioxide (C) for the resin composition. The stirring, mixing, and kneading treatments can be properly performed by using apparatuses aiming at mixing such as a ball mill and a bead mill, or known apparatuses such as revolution and rotation type mixing apparatuses. From the viewpoint of lowering the viscosity of the resin composition when the resin composition is prepared, to improve the handleability of the resin composition and the impregnatability of the glass cloth with the resin composition, an organic solvent is desirably added. Specific examples thereof are previously described.

The prepreg of the present embodiment may be obtained by combining the resin composition with a base material, specifically by impregnating or coating the base material with the resin composition. A method for producing the prepreg may be performed in accordance with an ordinary method without particular limitation. For example, the prepreg of the present embodiment can be produced by impregnating or coating the base material (D) with the resin composition (resin varnish) and thereafter heating the impregnated or coated base material in a drier of 100 to 200° C. for 1 to 60 min to semi-cure (B-stage) the resin composition. The resin content (the amount of the resin composition (containing the inorganic filler) based on the total amount of the prepreg) of the prepreg is preferably 20 to 90% by mass without particular limitation.

The base material (D) used when the prepreg is produced is not particularly limited. Known base materials used in various materials for printed wiring boards may be properly selected and used depending upon contemplated applications and properties. Specific examples thereof include glass fibers such as E-glass fibers, D-glass fibers, S-glass fibers, NE-glass fibers, T glass fibers, Q-glass fibers, and spherical glass fibers, inorganic fibers other than the glass fibers such as quartz fibers, and organic fibers such as polyimide, polyamide, and polyester fibers. These base materials may be properly selected and used depending upon contemplated applications and properties. The base materials may be used singly or in combinations of two or more. A woven cloth, a nonwoven cloth, a roving, a chopped strand mat, a surfacing mat and the like are known as the shape of the base material. Plain weave, basket weave, twill weave and the like are known as a method for weaving the woven cloth. These known products may be properly selected and used depending upon contemplated applications and properties. Among them, products subjected to split treatment and a glass woven cloth surface-treated by using a silane coupling agent or the like are suitably used. The thickness or mass of the base material is not particularly limited. Usually, the base material having a thickness of about 0.01 to 0.3 mm is suitably used. Especially, from the viewpoint of strength and water-absorption properties, the base material is preferably a glass woven cloth having a thickness of 200 µm or less and a mass of 250 g/m$^2$ or less, and more preferably a glass woven cloth made of a glass fiber of E-glass.

On the other hand, the metal foil-clad laminate of the present embodiment can be obtained by placing one prepreg or stacking at least two prepregs, disposing a metal foil on one side or both sides of the prepreg or the stacked prepregs, and laminate-molding the metal foil and the prepreg or the stacked prepregs. Specifically, the metal foil-clad laminate of the present embodiment can be produced by placing one prepreg or stacking a plurality of prepregs, disposing a metal foil made of copper, aluminum or the like on one side or both sides of the prepreg or the stacked prepregs if desired, and laminate-molding the metal foil and the prepreg or the stacked prepregs if necessary. Any metal foil used for the materials for printed wiring boards may be used herein without particular limitation, and known copper foils such as a rolling copper foil and an electrolysis copper foil are preferable. The thickness of the metal foil is not particularly limited. The thickness is preferably 2 to 70 µm, and more preferably 2 to 35 µm. A condition for molding the metal foil-clad laminate is not particularly limited. Techniques and conditions for conventional laminates for printed wiring boards and multilayered boards can be applied. For example, when the metal foil-clad laminate is molded, a multistage pressing machine, a multistage vacuum pressing machine, a continuous molding machine, an autoclave molding machine and the like can be used. The lamination molding is generally carried out in the ranges of a temperature of 100 to 300° C., a planar pressure of 2 to 100 kgf/cm², and a heating time of 0.05 to 5 hr. Furthermore, postcuring may also be performed at a temperature of 150 to 300° C. if necessary. A multilayered board can be formed by lamination molding of a combination of the prepreg of the present embodiment with a separately produced wiring board for an internal layer.

The metal foil-clad laminate of the present embodiment may be suitably used as the printed wiring board by forming a predetermined wiring pattern. The printed wiring board can be produced by an ordinary method without particular limitation. For example, a monolayer printed wiring board can be produced by forming a predetermined wiring pattern on the metal foil of the metal foil-clad laminate by etching. A multilayer printed wiring board can be produced by laminate-molding the metal foil on the printed wiring board with the prepreg sandwiched therebetween, and forming a predetermined wiring pattern on the metal foil by etching. Herein, the number of wiring layers can also be further increased by laminate-molding metal foil on the surface with the prepreg sandwiched therebetween and forming a predetermined wiring pattern on the metal foil by etching. As other method, a multilayer printed wiring board can be produced by interposing prepregs between a plurality of printed wiring boards, laminate-molding metal foils on the surface with the prepregs sandwiched therebetween, and forming a predetermined wiring pattern on the metal foils on the surface by etching. The metal foil-clad laminate and the printed wiring board of the present embodiment may be obtained by combining the prepreg of the present embodiment with other prepreg (for example, an organic fiber base material prepreg).

EXAMPLES

Hereinafter, the present invention will be described in detail with reference to synthesis examples, Examples, and Comparative Examples. However, the present invention is not limited by these Examples in any way. Hereinafter, unless otherwise noted, "part" represents "part by mass."

Synthesis Example 1

Synthesis of 1,5-Dimethylnaphthalene Formaldehyde Resin

In a bottom-removal four-necked flask having an internal volume of 2 L and equipped with a Dimroth condenser, a thermometer, and a stirring blade, 218 g (1.4 moles) of 1,5-dimethylnaphthalene (manufactured by Mitsubishi Gas Chemical Company, Inc.), 420 g (5.6 moles as formaldehyde) of a 40% by mass formalin aqueous solution (manufactured by Mitsubishi Gas Chemical Company, Inc.), and 194 g of 98% by mass sulfuric acid (manufactured by Kanto Chemical Co., Inc.) were placed, and the mixture was stirred and reacted in a nitrogen gas stream at atmospheric pressure while refluxing at 100° C. After the reaction for 7 hours, 360 g of ethylbenzene was added as a diluting solvent, and after allowing the mixture to stand, an aqueous phase as a lower phase was removed. Furthermore, after neutralization and washing with water, the ethylbenzene and unreacted 1,5-dimethylnaphthalene were distilled off in vacuo, thereby obtaining 250 g of a 1,5-dimethylnaphthalene formaldehyde resin which is solid at normal temperature.

A weight average molecular weight (Mw) and a number average molecular weight (Mn) as reduced into polystyrene were determined by means of a gel permeation chromatography (GPC) analysis, and a degree of dispersion (Mw/Mn) was determined. The resin had Mn of 550, Mw of 1,130, and Mw/Mn of 2.05.

Apparatus: Model Shodex GPC-101 (manufactured by Showa Denko K.K.)
Column: LF-804×3
Eluent: THF 1 ml/min
Temperature: 40° C.

Synthesis Example 2

Synthesis of Naphthol-Modified Dimethylnaphthalene Formaldehyde Resin

In a four-necked flask having an internal volume of 500 mL and equipped with a Dimroth condenser, a thermometer and a stirring blade, 90 g of the 1,5-dimethylnaphthalene formaldehyde resin obtained in synthesis Example 1, 71.1 g (0.49 moles) of 1-naphthol, and 0.36 g of p-toluenesulfonic acid were added in a nitrogen gas stream; the temperature was elevated to 185° C.; and the mixture was allowed to react for 4 hours. After diluting with ethylbenzene, neutralization and washing with water were carried out, and removal of the solvent and unreacted 1-naphthol was carried out in vacuo, thereby obtaining 160 g of a naphthol-modified dimethylnaphthalene formaldehyde resin.

As a result of the GPC measurement in the same manner as in the above measurement, the resin had Mn of 848, Mw of 1,630, and Mw/Mn of 1.93.

Example 1

Production of Prepreg 58 parts by mass of the naphthol-modified dimethylnaphthalene formaldehyde resin (hydroxyl equivalent: 440 g/eq.) obtained in synthesis example 2, 42 parts by mass of a biphenylaralkyl-based epoxy resin (NC-3000-FH, epoxy equivalent: 320 g/eq. manufactured by Nippon Kayaku Co., Ltd.), 100 parts by mass of fused silica (manufactured by Admatechs Co., Ltd.), and 0.02 part by mass of imidazole (2E4MZ, manufactured by Shikoku Chemicals Corporation) were mixed to prepare a varnish.

The varnish was diluted with methyl ethyl ketone. A 0.1 mm-thick E glass woven cloth was impregnated and coated with the diluted varnish. The E glass woven cloth was dried by heating at 165° C. for 3 min, to produce a prepreg having a resin content of 50% by mass.

Production of Metal Foil-Clad Laminate

The obtained four or eight prepregs were stacked respectively, and 12 μm-thick electrolysis copper foils were disposed on both upper and lower sides of the stack respectively. The copper foils and the stack were laminate-molded (pressure-molded) by using a pressing machine under conditions of a planar pressure of 30 kgf/cm², a temperature of 220° C., and a time of 120 min, to produce a metal foil-clad laminate having a 0.4 mm-thick insulating layer and a metal foil-clad laminate having a 0.8 mm-thick insulating layer.

Water absorption, insulation resistance, glass transition temperature, heat resistance after moisture absorption, and solder heat resistance were measured and evaluated for the obtained metal foil-clad laminates. Results are shown in Table 1.

<Measurement Methods>

Measurement methods and evaluation methods of test methods are as follows.

1) Water Absorption: the metal foil-clad laminate having a 0.4 mm-thick insulating layer was cut into a size of 30 mm×30 mm×0.4 mm with a dicing saw, and the copper foil formed on the surface was then left to obtain a sample. Water absorptions after treatment for 1, 3, and 5 hours were measured for the sample under conditions of a temperature of 121° C. and an atmosphere of 2 atm in a pressure cooker tester (PC-3 type manufactured by Hirayama Manufacturing Corporation) based on JIS C6481.

2) Insulation Resistance: the metal foil-clad laminate having a 0.4 mm-thick insulating layer was cut into a size of 40 mm×20 mm×0.4 mm with a dicing saw, and the copper foil formed on the whole surface was then removed by etching to remove the whole copper foil on the surface, thereby obtaining a sample. Insulation resistances after treatment for 1000 hours and non-treatment (treatment for 0 hours) were measured for the sample under conditions of a temperature of 121° C. and an atmosphere of 2 atm in a pressure cooker tester (PC-3 type manufactured by Hirayama Manufacturing Corporation) based on JIS C6481.

3) Glass Transition Temperature: the metal foil-clad laminate having a 0.8 mm-thick insulating layer was cut into a size of 40 mm×20 mm×0.4 mm with a dicing saw to obtain a sample. The glass transition temperature was measured for the sample with a dynamic viscoelasticity analyzer (manufactured by TA Instruments) based on JIS C6481.

4) Insulation Resistance Holding Rate: a value obtained by dividing a value obtained by subtracting a value of insulation resistance after treatment for 1000 hours from a value of insulation resistance after treatment for 0 hours measured in the above (2) by the value of the insulation resistance after the treatment for 1000 hours was represented by %.

5) Heat resistance after moisture absorption: the metal foil-clad laminate having a 0.4 mm-thick insulating layer was cut into a size of 50 mm×50 mm×0.4 mm with a dicing saw, and the whole copper foil other than a half part of one side was then removed by etching to leave a half part of the copper foil only on one side, thereby obtaining a test piece. The test piece was processed for 3, 4, and 5 hours under conditions of a temperature of 121° C. and an atmosphere of 2 atm in a pressure cooker tester (PC-3 type manufactured by Hirayama Manufacturing Corporation). The test piece was then immersed in a soldering vessel of 260° C. for 60 sec, and the change in appearance of the test piece was then visually observed (the occurrence number of swellings/the number of tests).

6) Solder Heat Resistance: the metal foil-clad laminate having a 0.4 mm-thick insulating layer was cut into a size of 50 mm×50 mm×0.4 mm with a dicing saw, and the copper foil formed on the surface was left to obtain a measuring sample. The change in appearance of the measuring sample was then visually observed in a state where the measuring sample was floated in a soldering vessel of 280° C. for 30 min, and a time until delamination occurred was measured. The notation ">30 min" in Table 1 means that the delamination does not occur even if 30 min passes.

Comparative Example 1

A prepreg and a metal foil-clad laminate were produced in the same manner as in Example 1 except that 42 parts by mass of a naphthol aralkyl phenolic resin (SN495V manufactured by Nippon Steel Chemical Co., Ltd., hydroxyl equivalent: 236 g/eq.) instead of 58 parts by mass of the naphthol-modified dimethylnaphthalene formaldehyde resin, 58 parts by mass of a biphenylaralkyl-based epoxy resin (NC-3000-FH), and 0.07 part by mass of imidazole (2E4MZ) were used, and a prepreg was dried at 165° C. for 9 min when the prepreg was produced.

Various measurements and evaluations were performed in the same manner as in Example 1 using the obtained metal foil-clad laminate. Results are shown in Table 1.

Comparative Example 2

A prepreg and a metal foil-clad laminate were produced in the same manner as in Example 1 except that 42 parts by mass of a biphenylaralkyl phenolic resin (KAYAHARD GPH-103 manufactured by Nippon Kayaku Co., Ltd., hydroxyl equivalent: 231 g/eq.) instead of 58 parts by mass of the naphthol-modified dimethylnaphthalene formaldehyde resin, 58 parts by mass of a biphenylaralkyl-based epoxy resin (NC-3000-FH), and 0.04 part by mass of imidazole (2E4MZ) were used, and a prepreg was dried at 165° C. for 4 min when the prepreg was produced.

Various measurements and evaluations were performed in the same manner as in Example 1 by using the obtained metal foil-clad laminate. Results are shown in Table 1.

TABLE 1

|  |  | Example 1 | Comparative Example 1 | Comparative Example 2 |
|---|---|---|---|---|
| Water absorption (%) | After treatment for 1 hour | 0.10 | 0.14 | 0.15 |
|  | After treatment for 3 hours | 0.17 | 0.22 | 0.22 |
|  | After treatment for 5 hours | 0.19 | 0.25 | 0.25 |
| Insulation resistance ($\Omega$) | After treatment for 0 hours | $2.6 \times 10^{13}$ | $5.4 \times 10^{14}$ | $1.1 \times 10^{15}$ |
|  | After treatment for 1000 hours | $1.8 \times 10^{12}$ | $1.9 \times 10^{11}$ | $5.2 \times 10^{12}$ |
| Insulation resistance holding rate (%) |  | 6.92 | 0.04 | 0.47 |
| Glass transition temperature (° C.) |  | 171 | 186 | 167 |
| Heat resistance after moisture absorption | After treatment for 3 hours | 0/4 | 0/4 | 0/4 |
|  | After treatment for 4 hours | 0/4 | 0/4 | 0/4 |
|  | After treatment for 5 hours | 0/4 | 0/4 | 0/4 |
| Solder heat resistance |  | >30 | >30 | >30 |

As seen clear from Table 1, it was confirmed that Comparative Examples 1 and 2 have water absorption higher than that of Example 1 and insulation resistance of Comparative Examples 1 and 2 remarkably lowered from an evaluation initial value. On the other hand, it was found that Example 1 has an absorption rate significantly lower than those of Comparative Examples 1 and 2 and an insulation resistance holding rate significantly higher than those of Comparative Examples 1 and 2 although glass transition temperature, and heat resistance represented by heat resistance after moisture absorption, solder heat resistance and the like of Example 1 are equivalent to those of Comparative Examples 1 and 2. From the above, it is suggested that Example 1 has stability and reliability remarkably higher than those of Comparative Examples 1 and 2.

As described above, the present invention is not limited to the above-mentioned embodiment and Examples, and modifications can be properly made in a scope that does not depart from the gist of the present invention.

INDUSTRIAL APPLICABILITY

As described above, the present invention can be widely and effectively utilized in various applications such as electrical and electronic materials, a machine tool material, and an aviation material which require a low absorption rate and high insulation stability. Particularly, the present invention can be effectively utilized in substrate applications such as a printed wiring board and a laminate which require a low absorption rate, high insulation stability, and excellent heat resistance.

The present application claims priority from Japanese Patent Application (Japanese Patent Application No. 2011-072637) filed to the Japan Patent Office on Mar. 29, 2011, the contents of which are hereby incorporated by reference.

The invention claimed is:

1. A prepreg obtained by impregnating or coating a base material (D) with a resin composition comprising:
a naphthol-modified dimethylnaphthalene formaldehyde resin (A) having a hydroxyl equivalent of 300 to 600 n/eq.;
an epoxy resin (B) having an epoxy equivalent of 250 to 350 g/eq.; and
an inorganic filler (C),
wherein the naphthol-modified dimethylnaphthalene formaldehyde resin (A) is obtained by condensing a dimethylnaphthalene formaldehyde resin and (c) a naphthol compound represented by the following general formula (1) in the presence of an acidic catalyst,

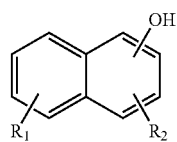

(1)

wherein $R_1$ and $R_2$ each independently represent a hydrogen atom or an alkyl group having 1 to 3 carbon atoms, and
the dimethylnaphthalene formaldehyde resin is obtained by condensing (a) at least one dimethylnaphthalene selected from the group consisting of 1,5-dimethylnaphthalene, 1,6-dimethylnaphthalene, 2,6-dimethylnaphthalene, 1,7-dimethylnaphthalene, 1,8-dimethylnaphthalene, and 2,7-dimethylnaphthalene and (b) formaldehyde in the presence of an acidic catalyst, the epoxy resin (B) is represented by the following formula (2):

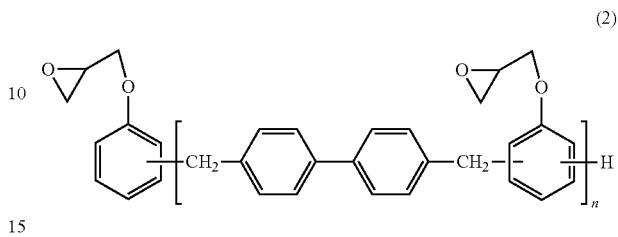

(2)

wherein n represents an integer of 1 or more,
the inorganic filler (C) is silica,
a content of the naphthol-modified dimethylnaphthalene formaldehyde resin (A) is 40 to 70 parts by mass based on 100 parts by mass in total of the naphthol-modified dimethylnaphthalene formaldehyde resin (A) and the epoxy resin (B),
a content of the epoxy resin (B) is 30 to 60 parts by mass based on 100 parts by mass in total of the naphthol-modified dimethylnaphthalene formaldehyde resin (A) and the epoxy resin (B), and
a content of the inorganic filler (C) is 5 to 300 parts by mass based on 100 parts by mass in total of the naphthol-modified dimethylnaphthalene formaldehyde resin (A) and the epoxy resin (B).

2. A metal foil-clad laminate using the prepreg according to claim 1.

3. A printed wiring board using the metal foil-clad laminate according to claim 2.

* * * * *

UNITED STATES PATENT AND TRADEMARK OFFICE
CERTIFICATE OF CORRECTION

PATENT NO. : 9,914,662 B2  
APPLICATION NO. : 14/007817  
DATED : March 13, 2018  
INVENTOR(S) : K. Arii et al.

Page 1 of 1

It is certified that error appears in the above-identified patent and that said Letters Patent is hereby corrected as shown below:

On the Title Page

At (75) Inventors, please change "Kenj, Arii" to -- Kenji, Arii --

In the Claims

Column 13, Line 15 (Claim 1, Line 5), please change "n/eq.;" to -- g/eq.; --

Signed and Sealed this  
Nineteenth Day of June, 2018

Andrei Iancu  
*Director of the United States Patent and Trademark Office*